United States Patent
Kazlas et al.

(10) Patent No.: US 7,893,435 B2
(45) Date of Patent: Feb. 22, 2011

(54) FLEXIBLE ELECTRONIC CIRCUITS AND DISPLAYS INCLUDING A BACKPLANE COMPRISING A PATTERNED METAL FOIL HAVING A PLURALITY OF APERTURES EXTENDING THERETHROUGH

(75) Inventors: Peter T. Kazlas, Sudbury, MA (US); Joanna F. Au, Brighton, MA (US); Yu Chen, Milpitas, CA (US); Nathan R. Kane, Arlington, MA (US); David John Cole, Medway, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 10/707,184

(22) Filed: Nov. 25, 2003

(65) Prior Publication Data

US 2004/0180476 A1 Sep. 16, 2004

Related U.S. Application Data

(63) Continuation-in-part of application No. 09/836,884, filed on Apr. 17, 2001, now Pat. No. 6,825,068.

(60) Provisional application No. 60/197,731, filed on Apr. 18, 2000, provisional application No. 60/319,732, filed on Nov. 26, 2002, provisional application No. 60/481,396, filed on Sep. 18, 2003.

(51) Int. Cl.
*H01L 29/04* (2006.01)

(52) U.S. Cl. .......... 257/59; 257/E51.005; 257/E29.151; 359/242; 359/243; 359/245; 438/149

(58) Field of Classification Search .................. 257/81, 257/99, 688, 59, E19.151, E51.005, E51.027, 257/79, E29.151; 438/349, 146, 149, 151, 438/155, 158; 359/242, 243, 245, 296
See application file for complete search history.

(56) References Cited

U.S. PATENT DOCUMENTS

| | | | |
|---|---|---|---|
| 3,036,388 A | 5/1962 | Tate | |
| 3,384,488 A | 5/1968 | Tulagin et al. | |
| 3,612,758 A | 10/1971 | Evans et al. | |
| 3,668,106 A | 6/1972 | Ota | |
| 3,670,323 A | 6/1972 | Sobel et al. | |
| 3,745,070 A | 7/1973 | Yada et al. | |

(Continued)

FOREIGN PATENT DOCUMENTS

EP 0 404 545 A2 12/1990

(Continued)

OTHER PUBLICATIONS

E. Y. Ma "Thin film transistors for foldable displays" 1997 IEEE (pp. 20.6.1-20.6.4).*
Amundson, K., et al., "Flexible, Active-Matrix Display Constructed Using a Microencapsulated Electrophoretic Material and an Organic-Semiconductor-Based Backplane", SID 01 Digest, 160 (Jun. 2001).
Au, J. et al., "Ultra-Thin 3.1-in. Active-Matrix Electronic Ink Display for Mobile Devices", IDW'02, 223 (2002).
Bach, U., et al., "Nanomaterials-Based Electrochromics for Paper-Quality Displays", Adv. Mater, 14(11), 845 (2002).
Bohnke et al., "Polymer-Based Solid Electrochromic Cell for Matrix-Addressable Display Devices." J. Electrochem. Soc., 138, 3612 (1991).
Caillot, E. et al. "Active Matrix Electrophoretic Information Display for High Performance Mobile Devices", IDMC Proceedings (2003).
Chen, Y., et al., "A Conformable Electronic Ink Display using a Foil-Based a-Si TFT Array", SID 01 Digest, 157 (Jun. 2001).

(Continued)

*Primary Examiner*—Khiem D Nguyen
(74) *Attorney, Agent, or Firm*—David J. Cole

(57) ABSTRACT

A backplane for use in an electro-optic display comprises a patterned metal foil having a plurality of apertures extending therethrough, coated on at least side with an insulating polymeric material and having a plurality of thin film electronic devices provided on the insulating polymeric material.

14 Claims, 8 Drawing Sheets

U.S. PATENT DOCUMENTS

| | | |
|---|---|---|
| 3,756,693 A | 9/1973 | Ota |
| 3,767,392 A | 10/1973 | Ota |
| 3,792,308 A | 2/1974 | Ota |
| 3,806,893 A | 4/1974 | Ohnishi et al. |
| 3,850,627 A | 11/1974 | Wells et al. |
| 3,870,517 A | 3/1975 | Ota et al. |
| 3,892,568 A | 7/1975 | Ota |
| 3,972,040 A | 7/1976 | Hilsum et al. |
| 4,001,140 A | 1/1977 | Foris et al. |
| 4,041,481 A | 8/1977 | Sato |
| 4,045,327 A | 8/1977 | Noma et al. |
| 4,068,927 A | 1/1978 | White |
| 4,071,430 A | 1/1978 | Liebert |
| 4,088,395 A | 5/1978 | Gigila |
| 4,112,309 A * | 9/1978 | Nakazawa et al. ..... 250/559.24 |
| 4,123,346 A | 10/1978 | Ploix |
| 4,149,149 A | 4/1979 | Miki et al. |
| 4,203,106 A | 5/1980 | Dalisa et al. |
| 4,218,302 A | 8/1980 | Dalisa et al. |
| 4,261,653 A | 4/1981 | Goodrich |
| 4,273,672 A | 6/1981 | Vassiliades |
| 4,305,807 A | 12/1981 | Somlyody |
| 4,311,361 A | 1/1982 | Somlyody |
| 4,324,456 A | 4/1982 | Dalisa |
| 4,390,403 A | 6/1983 | Batchelder |
| 4,418,346 A | 11/1983 | Batchelder |
| 4,430,648 A | 2/1984 | Togashi et al. |
| 4,439,507 A | 3/1984 | Pan et al. |
| 4,450,440 A | 5/1984 | White |
| 4,502,934 A | 3/1985 | Gazard et al. |
| 4,522,472 A | 6/1985 | Liebert et al. |
| 4,543,306 A | 9/1985 | Dubois et al. |
| 4,598,960 A | 7/1986 | DiSanto et al. |
| 4,643,528 A | 2/1987 | Bell, Jr. |
| 4,648,956 A | 3/1987 | Marshall et al. |
| 4,655,897 A | 4/1987 | DiSanto et al. |
| 4,686,524 A | 8/1987 | White |
| 4,741,604 A | 5/1988 | Kornfeld |
| 4,742,345 A | 5/1988 | DiSanto et al. |
| 4,746,917 A | 5/1988 | DiSanto et al. |
| 4,758,875 A | 7/1988 | Fujisaki et al. |
| 4,776,675 A | 10/1988 | Takaochi et al. |
| 4,828,967 A | 5/1989 | Mase et al. |
| 4,833,464 A | 5/1989 | DiSanto et al. |
| 4,850,919 A | 7/1989 | DiSanto et al. |
| 4,883,561 A | 11/1989 | Gmitter et al. |
| 4,892,607 A | 1/1990 | DiSanto et al. |
| 4,931,019 A | 6/1990 | Park |
| 4,947,157 A | 8/1990 | DiSanto et al. |
| 4,947,159 A | 8/1990 | DiSanto et al. |
| 4,954,612 A | 9/1990 | Nomura et al. |
| 5,008,590 A | 4/1991 | Huisman et al. |
| 5,009,490 A | 4/1991 | Kouno et al. |
| 5,028,841 A | 7/1991 | DiSanto et al. |
| 5,041,824 A | 8/1991 | DiSanto et al. |
| 5,053,763 A | 10/1991 | DiSanto et al. |
| 5,066,105 A | 11/1991 | Yoshimoto et al. |
| 5,066,946 A | 11/1991 | Disanto et al. |
| 5,070,326 A | 12/1991 | Yoshimoto et al. |
| 5,077,157 A | 12/1991 | DiSanto et al. |
| 5,105,185 A | 4/1992 | Nakanowatari et al. |
| 5,119,218 A | 6/1992 | Yoshimoto et al. |
| 5,128,226 A | 7/1992 | Hung |
| 5,128,785 A | 7/1992 | Yoshimoto et al. |
| 5,148,300 A | 9/1992 | Mizushima et al. |
| 5,153,986 A * | 10/1992 | Brauer et al. ................. 29/846 |
| 5,161,007 A | 11/1992 | Takanashi et al. |
| 5,174,882 A | 12/1992 | DiSanto et al. |
| 5,175,020 A | 12/1992 | Doellein et al. |
| 5,175,047 A | 12/1992 | McKenney et al. |
| 5,187,609 A | 2/1993 | DiSanto et al. |
| 5,194,852 A | 3/1993 | More et al. |
| 5,206,749 A | 4/1993 | Zavracky et al. |
| 5,216,416 A | 6/1993 | DiSanto et al. |
| 5,220,316 A | 6/1993 | Kazan |
| 5,223,115 A | 6/1993 | DiSanto et al. |
| 5,223,823 A | 6/1993 | Disanto et al. |
| 5,234,541 A | 8/1993 | Shannon et al. |
| 5,247,290 A | 9/1993 | DiSanto et al. |
| 5,250,938 A | 10/1993 | DiSanto et al. |
| 5,254,981 A | 10/1993 | Disanto et al. |
| 5,266,937 A | 11/1993 | DiSanto et al. |
| 5,270,843 A | 12/1993 | Wang |
| 5,276,438 A | 1/1994 | DiSanto et al. |
| 5,279,694 A | 1/1994 | DiSanto et al. |
| 5,288,541 A * | 2/1994 | Blackwell et al. ........... 428/209 |
| 5,293,528 A | 3/1994 | DiSanto et al. |
| 5,296,974 A | 3/1994 | Tada et al. |
| 5,302,235 A | 4/1994 | DiSanto et al. |
| 5,303,073 A | 4/1994 | Shirota et al. |
| 5,304,439 A | 4/1994 | DiSanto et al. |
| 5,315,312 A | 5/1994 | DiSanto et al. |
| 5,345,251 A | 9/1994 | DiSanto et al. |
| 5,362,671 A | 11/1994 | Zavracky et al. |
| 5,383,008 A | 1/1995 | Sheridon |
| 5,389,945 A | 2/1995 | Sheridon |
| 5,402,145 A | 3/1995 | DiSanto et al. |
| 5,403,772 A | 4/1995 | Zhang et al. |
| 5,411,656 A | 5/1995 | Schubert |
| 5,412,398 A | 5/1995 | DiSanto et al. |
| 5,460,688 A | 10/1995 | DiSanto et al. |
| 5,463,491 A | 10/1995 | Check, III |
| 5,463,492 A | 10/1995 | Check, III |
| 5,467,107 A | 11/1995 | DiSanto et al. |
| 5,500,537 A | 3/1996 | Tsumura et al. |
| 5,508,720 A | 4/1996 | DiSanto et al. |
| 5,543,589 A | 8/1996 | Buchana et al. |
| 5,545,291 A | 8/1996 | Smith et al. |
| 5,561,539 A | 10/1996 | Funahata et al. |
| 5,565,885 A | 10/1996 | Tamanoi |
| 5,569,610 A | 10/1996 | Zhang et al. |
| 5,571,311 A | 11/1996 | Belmont et al. |
| 5,575,554 A | 11/1996 | Guritz |
| 5,583,675 A | 12/1996 | Yamada et al. |
| 5,614,340 A | 3/1997 | Bugner et al. |
| 5,623,585 A | 4/1997 | Matias et al. |
| 5,625,199 A | 4/1997 | Baumbach et al. |
| 5,627,561 A | 5/1997 | Laspina et al. |
| 5,650,199 A | 7/1997 | Chang et al. |
| 5,650,872 A | 7/1997 | Saxe et al. |
| 5,684,501 A | 11/1997 | Knapp et al. |
| 5,688,584 A | 11/1997 | Casson et al. |
| 5,689,282 A | 11/1997 | Wolfs et al. |
| 5,705,424 A | 1/1998 | Zavracky et al. |
| 5,707,738 A | 1/1998 | Hou |
| 5,709,976 A | 1/1998 | Malhotra |
| 5,717,514 A | 2/1998 | Sheridon |
| 5,718,996 A | 2/1998 | Iijima et al. |
| 5,725,935 A | 3/1998 | Rajan |
| 5,731,116 A | 3/1998 | Matsuo et al. |
| 5,737,115 A | 4/1998 | Mackinlay et al. |
| 5,738,977 A | 4/1998 | Van Der Sluis-Van Der Voort et al. |
| 5,744,283 A | 4/1998 | Spierings et al. |
| 5,745,094 A | 4/1998 | Gordon, II et al. |
| 5,760,761 A | 6/1998 | Sheridon |
| 5,777,782 A | 7/1998 | Sheridon |
| 5,783,856 A | 7/1998 | Smith et al. |
| 5,786,875 A | 7/1998 | Brader et al. |
| 5,808,783 A | 9/1998 | Crowley |
| 5,821,137 A | 10/1998 | Wakai et al. |
| 5,854,380 A | 12/1998 | Seto et al. |
| 5,872,552 A | 2/1999 | Gordon, II et al. |
| 5,889,325 A * | 3/1999 | Uchida et al. ................. 257/724 |

| | | | | | | |
|---|---|---|---|---|---|---|
| 5,892,244 | A | 4/1999 | Tanaka et al. | 6,413,790 | B1 | 7/2002 | Duthaler et al. |
| 5,892,504 | A | 4/1999 | Knapp | 6,422,687 | B1 | 7/2002 | Jacobson |
| 5,894,367 | A | 4/1999 | Sheridon | 6,432,739 | B1 | 8/2002 | Gudesen et al. |
| 5,898,416 | A | 4/1999 | Kuijk et al. | 6,445,374 | B2 | 9/2002 | Albert et al. |
| 5,904,545 | A | 5/1999 | Smith et al. | 6,445,489 | B1 | 9/2002 | Jacobson et al. |
| 5,930,026 | A | 7/1999 | Jacobson et al. | 6,459,418 | B1 | 10/2002 | Comiskey et al. |
| 5,936,259 | A | 8/1999 | Katz et al. | 6,461,901 | B1 | 10/2002 | Noguchi |
| 5,961,804 | A | 10/1999 | Jacobson et al. | 6,473,072 | B1 | 10/2002 | Comiskey et al. |
| 5,969,376 | A | 10/1999 | Bao | 6,480,182 | B1 | 11/2002 | Turner et al. |
| 5,972,493 | A | 10/1999 | Iwasaki et al. | 6,483,123 | B1 | 11/2002 | Kim et al. |
| 5,980,763 | A | 11/1999 | Young | 6,498,114 | B1 | 12/2002 | Amundson et al. |
| 6,005,791 | A | 12/1999 | Gudesen et al. | 6,504,524 | B1 * | 1/2003 | Gates et al. .................. 345/107 |
| 6,005,817 | A | 12/1999 | Gudesen et al. | 6,506,438 | B2 * | 1/2003 | Duthaler et al. ............... 427/58 |
| 6,013,335 | A | 1/2000 | Hirata et al. | 6,512,354 | B2 | 1/2003 | Jacobson et al. |
| 6,017,584 | A | 1/2000 | Albert et al. | 6,515,649 | B1 | 2/2003 | Albert et al. |
| 6,027,958 | A * | 2/2000 | Vu et al. ....................... 438/110 | 6,518,513 | B1 | 2/2003 | Enomoto et al. |
| 6,033,742 | A * | 3/2000 | Iwanaga et al. ............. 428/1.31 | 6,518,949 | B2 | 2/2003 | Drzaic |
| 6,045,955 | A | 4/2000 | Vincent | 6,521,489 | B2 | 2/2003 | Duthaler et al. |
| 6,052,354 | A | 4/2000 | Gudesen et al. | 6,531,997 | B1 | 3/2003 | Gates et al. |
| 6,054,071 | A | 4/2000 | Mikkelsen, Jr. | 6,535,197 | B1 | 3/2003 | Comiskey et al. |
| 6,055,091 | A | 4/2000 | Sheridon et al. | 6,538,801 | B2 | 3/2003 | Jacobson et al. |
| 6,055,180 | A | 4/2000 | Gudesen et al. | 6,545,291 | B1 | 4/2003 | Amundson et al. |
| 6,064,091 | A | 5/2000 | Deane et al. | 6,580,545 | B2 | 6/2003 | Morrison et al. |
| 6,067,185 | A | 5/2000 | Albert et al. | 6,583,780 | B1 | 6/2003 | Kawai |
| 6,084,850 | A | 7/2000 | Gudesen et al. | 6,639,578 | B1 | 10/2003 | Comiskey et al. |
| 6,088,319 | A | 7/2000 | Gudesen | 6,652,075 | B2 | 11/2003 | Jacobson |
| 6,091,382 | A | 7/2000 | Shioya et al. | 6,657,772 | B2 | 12/2003 | Loxley |
| 6,097,531 | A | 8/2000 | Sheridon | 6,664,944 | B1 | 12/2003 | Albert et al. |
| 6,118,426 | A | 9/2000 | Albert et al. | 6,672,921 | B1 | 1/2004 | Liang et al. |
| 6,120,588 | A | 9/2000 | Jacobson | 6,680,725 | B1 | 1/2004 | Jacobson |
| 6,120,839 | A | 9/2000 | Comiskey et al. | 6,683,333 | B2 | 1/2004 | Kazlas et al. |
| 6,124,851 | A | 9/2000 | Jacobson | 6,693,620 | B1 | 2/2004 | Herb et al. |
| 6,128,124 | A | 10/2000 | Silverman | 6,704,133 | B2 | 3/2004 | Gates et al. |
| 6,130,773 | A | 10/2000 | Jacobson et al. | 6,710,540 | B1 | 3/2004 | Albert et al. |
| 6,130,774 | A | 10/2000 | Albert et al. | 6,721,083 | B2 | 4/2004 | Jacobson et al. |
| 6,137,467 | A | 10/2000 | Sheridon et al. | 6,724,519 | B1 | 4/2004 | Comiskey et al. |
| 6,144,361 | A | 11/2000 | Gordon, II et al. | 6,727,881 | B1 | 4/2004 | Albert et al. |
| 6,147,791 | A | 11/2000 | Sheridon | 6,738,050 | B2 | 5/2004 | Comiskey et al. |
| 6,172,798 | B1 | 1/2001 | Albert et al. | 6,750,473 | B2 | 6/2004 | Amundson et al. |
| 6,172,878 | B1 * | 1/2001 | Takabayashi et al. ....... 361/760 | 6,753,999 | B2 | 6/2004 | Zehner et al. |
| 6,177,921 | B1 | 1/2001 | Comiskey et al. | 6,788,449 | B2 | 9/2004 | Liang et al. |
| 6,184,856 | B1 | 2/2001 | Gordon, II et al. | 6,816,147 | B2 | 11/2004 | Albert |
| 6,212,057 | B1 * | 4/2001 | Kohara et al. ............. 361/301.4 | 6,819,471 | B2 | 11/2004 | Amundson et al. |
| 6,219,253 | B1 | 4/2001 | Green | 6,822,782 | B2 | 11/2004 | Honeyman et al. |
| 6,225,971 | B1 | 5/2001 | Gordon, II et al. | 6,825,068 | B2 | 11/2004 | Denis et al. |
| 6,232,950 | B1 | 5/2001 | Albert et al. | 6,825,829 | B1 | 11/2004 | Albert et al. |
| 6,239,896 | B1 | 5/2001 | Ikeda | 6,825,970 | B2 | 11/2004 | Goenaga et al. |
| 6,241,921 | B1 | 6/2001 | Jacobson et al. | 6,831,769 | B2 | 12/2004 | Holman et al. |
| 6,249,271 | B1 | 6/2001 | Albert et al. | 6,839,158 | B2 | 1/2005 | Albert et al. |
| 6,252,564 | B1 | 6/2001 | Albert et al. | 6,842,167 | B2 | 1/2005 | Albert et al. |
| 6,262,706 | B1 | 7/2001 | Albert et al. | 6,842,279 | B2 | 1/2005 | Amundson |
| 6,262,833 | B1 | 7/2001 | Loxley et al. | 6,842,657 | B1 | 1/2005 | Drzaic et al. |
| 6,271,823 | B1 | 8/2001 | Gordon, II et al. | 6,844,957 | B2 * | 1/2005 | Matsumoto et al. ......... 359/296 |
| 6,281,038 | B1 | 8/2001 | Jacobsen et al. | 6,864,875 | B2 | 3/2005 | Drzaic et al. |
| 6,300,932 | B1 | 10/2001 | Albert | 6,865,010 | B2 | 3/2005 | Duthaler et al. |
| 6,301,038 | B1 | 10/2001 | Fitzmaurice et al. | 6,866,760 | B2 | 3/2005 | Paolini Jr. et al. |
| 6,312,304 | B1 | 11/2001 | Duthaler et al. | 6,870,657 | B1 | 3/2005 | Fitzmaurice et al. |
| 6,312,971 | B1 | 11/2001 | Amundson et al. | 6,870,661 | B2 | 3/2005 | Pullen et al. |
| 6,323,034 | B1 | 11/2001 | Chen et al. | 6,900,851 | B2 | 5/2005 | Morrison et al. |
| 6,323,989 | B1 * | 11/2001 | Jacobson et al. ............ 359/296 | 6,982,178 | B2 * | 1/2006 | LeCain et al. ................. 438/22 |
| 6,327,072 | B1 | 12/2001 | Comiskey et al. | 7,046,328 | B2 * | 5/2006 | Jacobsen et al. ............ 349/158 |
| 6,343,164 | B1 | 1/2002 | Robertsson et al. | 2002/0060321 | A1 | 5/2002 | Kazlas et al. |
| 6,355,125 | B1 * | 3/2002 | Tahon et al. .................. 156/99 | 2002/0063661 | A1 | 5/2002 | Comiskey et al. |
| 6,356,332 | B1 | 3/2002 | Ichikawa et al. | 2002/0090980 | A1 | 7/2002 | Wilcox et al. |
| 6,359,605 | B1 | 3/2002 | Knapp et al. | 2002/0113770 | A1 | 8/2002 | Jacobson et al. |
| 6,373,454 | B1 | 4/2002 | Knapp et al. | 2002/0130832 | A1 | 9/2002 | Baucom et al. |
| 6,373,461 | B1 | 4/2002 | Hasegawa et al. | 2002/0180687 | A1 | 12/2002 | Webber |
| 6,373,545 | B1 * | 4/2002 | Yang et al. .................. 349/149 | 2003/0011560 | A1 | 1/2003 | Albert et al. |
| 6,376,828 | B1 | 4/2002 | Comiskey | 2003/0020844 | A1 | 1/2003 | Albert et al. |
| 6,377,387 | B1 | 4/2002 | Duthaler et al. | 2003/0102858 | A1 | 6/2003 | Jacobson et al. |
| 6,392,785 | B1 | 5/2002 | Albert et al. | 2003/0132908 | A1 | 7/2003 | Herb et al. |
| 6,392,786 | B1 | 5/2002 | Albert | 2003/0137521 | A1 | 7/2003 | Zehner et al. |
| 6,403,396 | B1 | 6/2002 | Gudesen et al. | 2003/0157783 | A1 * | 8/2003 | Fonash et al. ................ 438/458 |

| | | | |
|---|---|---|---|
| 2003/0214695 A1 | 11/2003 | Abramson et al. | |
| 2003/0222315 A1 | 12/2003 | Amundson et al. | |
| 2004/0012839 A1 | 1/2004 | Cao et al. | |
| 2004/0014265 A1 | 1/2004 | Kazlas et al. | |
| 2004/0027327 A1 | 2/2004 | LeCain et al. | |
| 2004/0075634 A1 | 4/2004 | Gates | |
| 2004/0094422 A1 | 5/2004 | Pullen et al. | |
| 2004/0105036 A1 | 6/2004 | Danner et al. | |
| 2004/0108504 A1* | 6/2004 | Forbes et al. | 257/72 |
| 2004/0112750 A1 | 6/2004 | Jacobson et al. | |
| 2004/0119681 A1 | 6/2004 | Albert et al. | |
| 2004/0136048 A1 | 7/2004 | Arango et al. | |
| 2004/0155857 A1 | 8/2004 | Duthaler et al. | |
| 2004/0180476 A1 | 9/2004 | Kazlas et al. | |
| 2004/0190114 A1 | 9/2004 | Jacobson et al. | |
| 2004/0196215 A1 | 10/2004 | Duthaler et al. | |
| 2004/0226820 A1 | 11/2004 | Webber et al. | |
| 2004/0233509 A1 | 11/2004 | Zhang et al. | |
| 2004/0239614 A1 | 12/2004 | Amundson et al. | |
| 2004/0252360 A1 | 12/2004 | Webber et al. | |
| 2004/0257635 A1 | 12/2004 | Paolini, Jr. et al. | |
| 2004/0263947 A1 | 12/2004 | Drzaic et al. | |
| 2005/0000813 A1 | 1/2005 | Pullen et al. | |
| 2005/0001812 A1 | 1/2005 | Amundson et al. | |
| 2005/0007336 A1 | 1/2005 | Albert et al. | |
| 2005/0007653 A1 | 1/2005 | Honeyman et al. | |
| 2005/0012980 A1 | 1/2005 | Wilcox et al. | |
| 2005/0017944 A1 | 1/2005 | Albert | |
| 2005/0018273 A1 | 1/2005 | Honeyman et al. | |
| 2005/0024353 A1 | 2/2005 | Amundson et al. | |
| 2005/0035941 A1 | 2/2005 | Albert et al. | |
| 2005/0041004 A1 | 2/2005 | Gates et al. | |
| 2005/0062714 A1 | 3/2005 | Zehner et al. | |
| 2005/0067656 A1 | 3/2005 | Denis et al. | |
| 2005/0078099 A1 | 4/2005 | Amundson et al. | |
| 2005/0099672 A1 | 5/2005 | Jacobson et al. | |
| 2005/0105159 A1 | 5/2005 | Paolini, Jr. et al. | |
| 2005/0105162 A1 | 5/2005 | Paolini, Jr. et al. | |
| 2005/0122284 A1 | 6/2005 | Gates et al. | |
| 2005/0122306 A1 | 6/2005 | Wilcox et al. | |
| 2005/0122563 A1 | 6/2005 | Honeyman et al. | |
| 2005/0122564 A1 | 6/2005 | Zehner et al. | |
| 2005/0122565 A1 | 6/2005 | Doshi et al. | |
| 2006/0001023 A1* | 1/2006 | Akiyama et al. | 257/59 |

FOREIGN PATENT DOCUMENTS

| | | |
|---|---|---|
| EP | 0 443 571 A2 | 8/1991 |
| EP | 0 618 715 A1 | 10/1994 |
| EP | 0 709 713 A2 | 5/1996 |
| EP | 0 924 551 A1 | 6/1999 |
| EP | 1 145 072 B1 | 5/2003 |
| GB | 2 098 800 A | 11/1982 |
| GB | 2 149 548 A | 6/1985 |
| GB | 2 306 229 A | 4/1997 |
| JP | 62-058222 A | 3/1987 |
| JP | 63-084089 | 4/1988 |
| JP | 05-061421 A | 3/1993 |
| JP | 11-202804 A | 7/1999 |
| JP | 2001-022301 | 1/2001 |
| WO | WO 95/06307 | 3/1995 |
| WO | WO 95/10107 | 4/1995 |
| WO | WO 99/20682 | 4/1999 |
| WO | WO 99/63527 | 12/1999 |
| WO | WO 00/05312 | 2/2000 |
| WO | WO 00/05704 | 2/2000 |
| WO | WO 00/22051 | 4/2000 |
| WO | WO 00/36560 | 6/2000 |
| WO | WO 00/38000 | 6/2000 |
| WO | WO 00/67110 | 11/2000 |
| WO | WO 00/67327 | 11/2000 |
| WO | WO 01/07961 | 2/2001 |

OTHER PUBLICATIONS

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Dalisa, A.L., "Electrophoretic Display Technology", IEEE Trans. Electron Dev., ED-24, 827 (1977).

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 98 Digest (1998), p. 1131.

Duthaler, G., et al., "Active-Matrix Color Displays Using Electrophoretic Ink and Color Filters", SID 02 Digest, 1374 (2002).

Gleskova et al., IEEE Electron Device Letters, 20(9), 473 (1999).

Gutcho, M.N., Microcapsules and MIcroencapsulation Techniques, Noyes Data Corp., Park Ridge NJ, (1976).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Jacobson, J., et al., "The last book", IBM Systems J., 36, 457 (1997).

Jo, G-R, et al., "Toner Display Based on Particle Movements", Chem. Mater, 14, 664 (2002).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances", SID 01 Digest, 152 (Jun. 2001).

Kitamura, T., et al, "Electrical toner movement for electronic paper-like display", Asia Display/IDW '01, p. 1517, Paper HCS1-1 (2001).

Kornfeld, A Defect-Tolerant Active-Matrix Electrophoretic Display, SID Digest, 1984, p. 142.

Ma et al., Applied Physics Letters, 74(18), 2661 (1999)).

Ma, E.Y. et al., "Thin Film Transistors For Foldable Displays", IEDM 97, 535-538, (1997).

Moesner, F.M., et al., "Devices for Particle Handling by an AC Electric Field", IEEE, 1995, p. 66.

Nakamura, E., et al., "Development of Electrophoretic Display Using Microcapsulated Suspension," SID 98 Digest (1998), p. 1014.

O'Regan, B. et al., "A Low Cost, High-efficiency Solar Cell Based on Dye-sensitized colloidal $TiO_2$ Films", Nature, vol. 353, Oct. 24, 1991, 773-740.

Ota, I., et al., "Developments in Electrophoretic Displays", Proceedings of the SID, 18, 243 (1977).

Ota, I., et al., "Electrophoretic display devices", Laser 75 Optoelectronics Conference Proceedings, 145 (1975).

Ota, I., et al., "Electrophoretic Image Display (EPID) Panel", Proceedings of the IEEE, 61, 832 (1973).

Pitt, M.G., et al., "Power Consumption of Microencapsulated Electrophoretic Displays for Smart Handheld Applications", SID 02 Digest, 1378 (2002).

Ridley, B.A. et al., "All-Inorganic Field Effect Transistors by Printing," Science, 286, 746 (1999).

Shiffman, R.R., et al., "An Electrophoretic Image Display with Internal NMOS Address Logic and Display Drivers," Proceedings of the SID, 1984, vol. 25, 105.

Vandegaer, J.E. (ed.), "Microencapsulation Processes and Applications", pp. v-x, 1-180 (Plenum Press, New York 1974).

Webber, R., "Image Stability in Active-Matrix Microencapsulated Electrophoretic Displays", SID 02 Digest, 126 (2002).

Wood, D., "An Electrochromic Renaissance?" Information Display, 18(3), 24 (Mar. 2002).

Yamaguchi, Y., et al., "Toner display using insulative particles charged triboelectrically", Asia Display/IDW '01, p. 1729, Paper AMD4-4 (2001).

Zehner, R. et al., "Drive Waveforms for Active Matrix Electrophoretic Displays", SID 03 Digest, 842 (2003).

* cited by examiner

FLEXIBLE ELECTRONIC CIRCUITS AND DISPLAYS INCLUDING A BACKPLANE COMPRISING A PATTERNED METAL FOIL HAVING A PLURALITY OF APERTURES EXTENDING THERETHROUGH

CROSS REFERENCE TO RELATED APPLICATIONS

This application is a continuation-in-part of application Ser. No. 09/836,884, filed Apr. 17, 2001 (now U.S. Pat. No. 6,825,068), and claiming benefit of Application Ser. No. 60/197,731, filed Apr. 18, 2000. This application also claims benefit of Application Ser. No. 60/319,732, filed Nov. 26, 2002 and Application Ser. No. 60/481,396, filed Sep. 18, 2003. The entire contents of these three applications are herein incorporated by reference. The entire contents of all U.S. patents and applications mentioned below are also herein incorporated by reference.

BACKGROUND OF INVENTION

This invention relates to flexible electronic circuits and displays. More specifically, this invention relates to such circuits and displays using electro-optic media. This invention also relates to production of electro-optic displays on curved surfaces; these surfaces may be curved in one or both dimensions. This invention is especially but not exclusively concerned with electro-optic displays using encapsulated electrophoretic media.

The term "electro-optic" as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published U.S pat. application Ser.No. 2002/0180687 (see also the corresponding International Application Publication No. WO 02/079869) that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777, 782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed to applying an electric field thereto, thus rotating the bodies to various positions and varying which of the sections of the bodies is seen through a viewing surface.

Another type of electro-optic medium is an organic light emitting diode (OLED) medium is which light generation is effected by passing current through a plurality of diodes formed from an organic material.

Another type of electro-optic medium uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. No. 6,301,038, International Application Publication No. WO 01/27690, and in copending application Ser. No. 10/249,128, filed Mar. 18, 2003 (Publication No. 2003/0214695).

Another type of electro-optic display, which has been the subject of intense research and development for a number of years, is the particle-based electrophoretic display, in which a plurality of charged particles move through a suspending fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; 6,580,545; and 6,639,578; and U.S. Patent Applications Publication Nos. 2002/0019081; 2002/0021270; 2002/0053900; 2002/0060321; 2002/0063661; 2002/0063677; 2002/0090980; 2002/0106847; 2002/0113770; 2002/0130832; 2002/0131147; 2002/0145792; 2002/

0171910; 2002/0180687; 2002/0180688; 2002/0185378; 2003/0011560; 2003/0011867; 2003/0011868; 2003/0020844; 2003/0025855; 2003/0034949; 2003/0038755; 2003/0053189; 2003/0076573; 2003/0096113; 2003/0102858; 2003/0132908; 2003/0137521; 2003/0137717; and 2003/0151702; and International Applications Publication Nos. WO 99/67678; WO 00/05704; WO 00/38000; WO 00/38001; WO 00/36560; WO 00/67110; WO 00/67327; WO 01/07961; and WO 01/08241.

Many of the aforementioned patents and applications recognize that the walls surrounding the discrete microcapsules in an encapsulated electrophoretic medium could be replaced by a continuous phase, thus producing a so-called polymer-dispersed electrophoretic display in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink-jet printing processes; and other similar techniques.) Thus, the resulting display can be flexible. Further, because the display medium can be printed (using a variety of methods), the display itself can be made inexpensively.

A related type of electrophoretic display is a so-called "microcell electrophoretic display". In a microcell electrophoretic display, the charged particles and the suspending fluid are not encapsulated within microcapsules but instead are retained within a plurality of cavities formed within a carrier medium, typically a polymeric film. See, for example, International Applications Publication No. WO 02/01281, and published U.S. application Ser. No. 2002/0075556, both assigned to Sipix Imaging, Inc.

As already mentioned, one major advantage of many of the electro-optic media discussed above is their ability to be printed or coated on to a wide variety of flexible and rigid substrates. The aforementioned US US2002/0019081 describes flexible encapsulated electrophoretic displays formed by coating a stainless steel (or similar metal) foil with a polymeric layer, forming thin film transistors on the polymer and then coating the transistors with the encapsulated electrophoretic medium to form an active matrix display. Other publications relating to similar displays include:

Chen, Y., et al., SID Intl. Symp. Digest Tech. Papers, San Jose 2001 (Society of Information Display, San Jose), p. 157;

Kazlas, P., et al., 22nd Intl. Display Research Conference Nice 2002 (Society of Information Display, San Jose); and Au, J., et al., 9th Intl. Display Workshops Hiroshima 2002 (Society of Information Display, San Jose).

The preferred flexible displays described in these publications use a thin (75-250 µm) continuous stainless steel foil as the substrate. Steel was chosen as the transistor substrate material because of its overall performance from initial transistor processing through final operating display. High-quality, low-cost steel foils are available in high-volume, and the high-temperature and excellent dimensional stability properties of steel allow formation of thin film transistors (TFT's) without any pre-processing (for example, bake-out or thin-film capping) using conventional TFT manufacturing technologies. Through front and back-end processing, steel foil substrates exhibit excellent handling properties owing to the material's strength, flatness and conductivity (which avoids problems due to electrostatic charge accumulation on the substrate during processing).

However, stainless steel and similar metal foils do have the disadvantage that they are substantially denser than other potential substrate materials such as plastics. As a result, flexible displays using such metal substrates of the type described in the aforementioned publications will weigh more than displays formed on plastic substrates of the same thickness.

In one aspect, the present invention seeks to provide a backplane for use in an electro-optic display, this backplane using a metal substrate but being lighter in weight than the metal-based substrates described above.

In another aspect, the present invention relates to assembly of electro-optic displays, and especially encapsulated electrophoretic displays, on to surfaces which are curved in one or both dimensions. Such curved surfaces are found, for example, in watches, electric shavers, cellular telephones and various other consumer electronics products. It has been found that, if one attempts to form an encapsulated electrophoretic display on a curved surface by coating a layer of electrophoretic medium on a flat surface (as most traditional printing and similar coating processes require) and then deforming the layer of electrophoretic medium to the desired curved configuration, substantial damage to the electrophoretic medium may occur, depending upon the exact curved configuration required. Such damage may include creep, which results in non-uniform switching of the electrophoretic medium, and/or rupture of some capsules, with resultant poor electro-optic performance, including reduction in contrast ratio and operating lifetime. Similar problems may be experienced with other types of electro-optic media.

The present invention provides processes which permit the assembly of electro-optic displays on curved substrates while reducing or eliminating the aforementioned problems.

SUMMARY OF INVENTION

Accordingly, in one aspect this invention provides a backplane for use in an electro-optic display, the backplane comprising a patterned metal foil having a plurality of apertures extending therethrough, coated on at least side with an insulating polymeric material and having a plurality of thin film electronic devices provided on the insulating polymeric material. This aspect of the invention may hereinafter be called the "patterned metal foil backplane".

In this backplane, the apertures may be arranged on a rectangular grid, and may occupy at least about 30 percent, and preferably at least about 60 percent, of the area of the patterned metal foil. Typically, the patterned metal foil is coated on both sides with an insulating polymeric material; it may be coated on both sides with the same insulating polymeric material, or may be coated on its two sides with different insulating polymeric materials.

In some embodiments of the invention, each of the thin film electronic devices lies entirely within the area of one aperture in the metal foil. In other embodiments, each of the thin film electronic devices extends across a plurality of apertures in the metal foil.

This invention extends to an electro-optic display comprising a backplane of the present invention, especially such an electro-optic display comprising an encapsulated electrophoretic electro-optic medium.

In another aspect, this invention provides a backplane for use in an electro-optic display, the backplane comprising a metal foil coated on at least one side with an insulating polymeric material and having a plurality of thin film electronic devices provided on the insulating polymeric material, the backplane further comprising at least one conductive via extending through the polymeric material and electrically connecting at least one of the thin film electronic devices to the metal foil. This aspect of the invention may hereinafter be called the "conductive via backplane".

In the conductive via backplane, the metal foil serves as at least one of an antenna, an inductor loop, a power plane, a capacitor, a capacitor contact, a pixel electrode, and electromagnetic induction shielding.

This invention extends to an electro-optic display comprising a conductive via backplane of the present invention. Such an electro-optic display may be in the form of a smart card having an electro-optic display thereon, the metal foil serving to communicate between the card and a card reading apparatus.

In another aspect, this invention provides a process for driving a backplane comprising a conductive layer, an insulating layer and at least one transistor disposed on the opposed side of the insulating layer from the conductive layer, the process comprising varying the voltage applied to the gate of the transistor and thereby switching the transistor between on and off states, the process further comprising maintaining the conductive layer at a voltage different from ground and within the range of voltages applied to the source of the transistor during driving of the backplane. This aspect of the invention may hereinafter be called the "controlled voltage conductive layer".

Typically, in this process, the voltage applied to the conductive layer satisfies the relation:

$$(3*V\text{max}+V\text{min})/4 > Vc > (V\text{max}+3*V\text{min})/4$$

where Vmax and Vmin are respectively the maximum and minimum voltages applied to the source during driving, and Vc is the voltage applied to the conductive layer. Preferably, the voltage satisfies the relation:

$$(3*V\text{max})+2*V\text{min})/5 > Vc > (2*V\text{max}+3*V\text{min})/5$$

and most desirably the voltage substantially satisfies the relation:

$$Vc=(V\text{max}+V\text{min})/2.$$

In another aspect, this invention provides a process for forming a plurality of electronic components on a polymeric material coating a metal substrate, the process comprising forming a plurality of discrete areas of polymeric material on the metal substrate and thereafter forming the plurality of electronic components on the discrete areas of polymeric material. For reasons discussed below, this aspect of the invention may hereinafter be called the "mesa process".

In this mesa process, a continuous layer of the polymeric material may be formed on the metal substrate and thereafter this continuous layer may be divided to form the discrete areas of polymeric material. Desirably, at least some of the edges of the discrete areas of polymeric material are undercut; such undercutting of the edges of the discrete areas of polymeric material may be effected by an etching step.

In another aspect, this invention provides an electro-optic display having a metal substrate, the display having a central portion comprising an electro-optic material and means for writing an image on the electro-optic material, and a peripheral portion extending around at least part of the periphery of the central portion, the peripheral portion having a plurality of apertures extending through the metal substrate, by means of which apertures the electro-optic display may be stitched to a flexible medium. This aspect of the invention may hereinafter be called the "stitchable display".

In such a stitchable display, the peripheral portion of the display is desirably free from the electro-optic material. The peripheral portion of the display may extend completely around the central portion so that the entire periphery of the electro-optic display can be stitched into the fabric or other flexible material.

In another aspect, this invention provides a process for forming an electro-optic display on a substrate curved in one dimension, the process comprising:

providing a backplane having at least one pixel electrode, the backplane being curved in one dimension;

applying to the backplane a laminate comprising a layer of electro-optic medium and a light-transmissive electrically-conductive layer, the laminate being applied so that the electro-optic medium lies between the backplane and the electrically-conductive layer; and bonding the laminate to the backplane under heat and/or pressure.

This aspect of the invention may hereinafter be called the "first 1D-curved process". In this process, the laminate may further comprise a layer of lamination adhesive overlying the layer of electro-optic medium, and the layer of lamination adhesive is contacted with the backplane.

In another aspect, this invention provides a process for forming an electro-optic display on a substrate curved in one dimension, the process comprising:

providing a backplane having at least one pixel electrode, the backplane being curved in one dimension;

providing a double release film comprising a layer of a solid electro-optic medium having first and second adhesive layers on opposed sides thereof, at least one of the adhesive layer being covered by a release sheet;

exposing one of the first and second adhesive layers and laminating the double release sheet to the backplane; and exposing the other of the first and second adhesive layers and laminating the exposed adhesive layer to an electrically-conductive layer.

This aspect of the invention may hereinafter be called the "second 1D-curved process".

Finally, this invention provides a process for forming an electro-optic display on a curved backplane having at least one pixel electrode, the process comprising:

applying a coatable electro-optic medium on to the surface of the backplane to form a coherent layer of the electro-optic medium thereon;

applying a transparent electrically-conductive layer on to the surface of the electro-optic medium on the backplane to form a coherent layer of the electrically-conductive layer thereon; and applying a transparent encapsulant on to the surface of the electrically-conductive layer to form a coherent layer of the encapsulant thereon.

This aspect of the invention may hereinafter be called the "2D-curved process". This process may further comprise applying an edge sealant around at least part of the edge of the display.

DETAILED DESCRIPTION

As indicated above, the present invention has several different aspects providing improvements in backplanes for electro-optic displays, and processes for the formation of such backplanes and displays. For ease of comprehension, the various different aspects of the invention will hereinafter be described separately, but it should be understood that a single backplane or display may make use of more than one aspect of the invention; for example, the 1D-curved processes of the invention may be carried out using a patterned metal foil backplane of the invention.

Patterned Metal Foil Backplane

As already mentioned, in one aspect this invention provides a backplane for use in an electro-optic display, this backplane comprising a patterned metal foil coated on one or both sides with an insulating polymeric material and having a plurality of thin film electronic devices provided on the insulating polymeric material. The resulting backplane is light in weight but substantially maintains the dimensional stability of a continuous metal foil.

Figure 1:
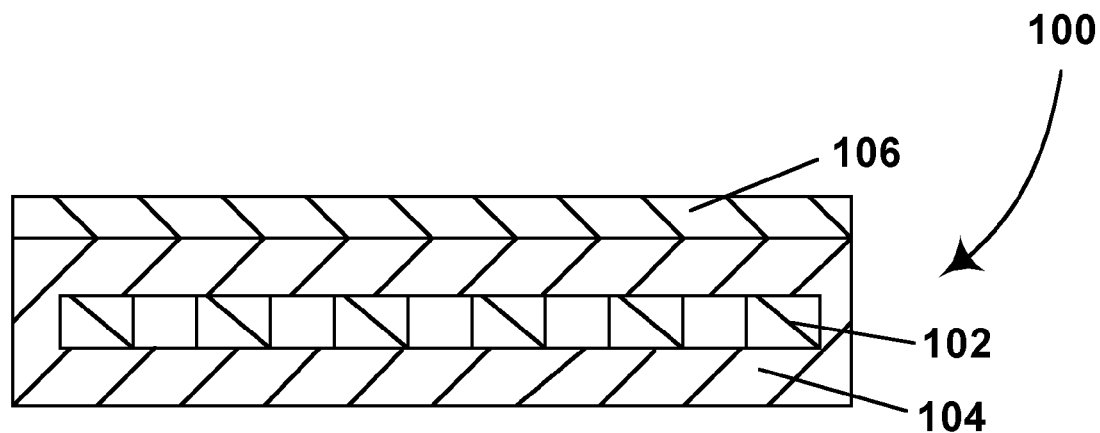
FIG. 1 is a schematic cross-section through a first patterned metal foil backplane of the present invention.

FIG. 1 of the accompanying drawings is a schematic cross-section through a preferred patterned metal foil backplane (generally designated 100) of the present invention. This backplane 100 comprises a patterned metal foil 102, which is preferably patterned in the form of a rectangular or square grid, coated on both sides with a polymeric material 104, and having an electronic layer 106, containing TFT's and/or other electronic components, on one exposed surface of the polymeric material 104. The foil 102 is preferred comprised of a steel foil, desirably a stainless steel foil, while the polymeric material 104 is desirably a high temperature polyimide, for example HD Microsystems 5878G. The foil 102 can be patterned in a number of ways including cold rolling molten steel onto a patterned roller, stamping, laser patterning or photo-etching. Alternatively, patterned metal foils can be manufactured by fabricating thin metal fibers and weaving them into various patterns. Any wet coating or printing method may be used to apply the polymeric material 104 to the patterned foil 102. Alternatively, the polymeric material, for example Upilex VT, can be laminated to the metal foil. The polymeric material can be polymerized by traditional thermal or UV-polymerization methods. In some applications, it may be sufficient to only coat one side of the metal foil with the polymeric material.

Figure 2:
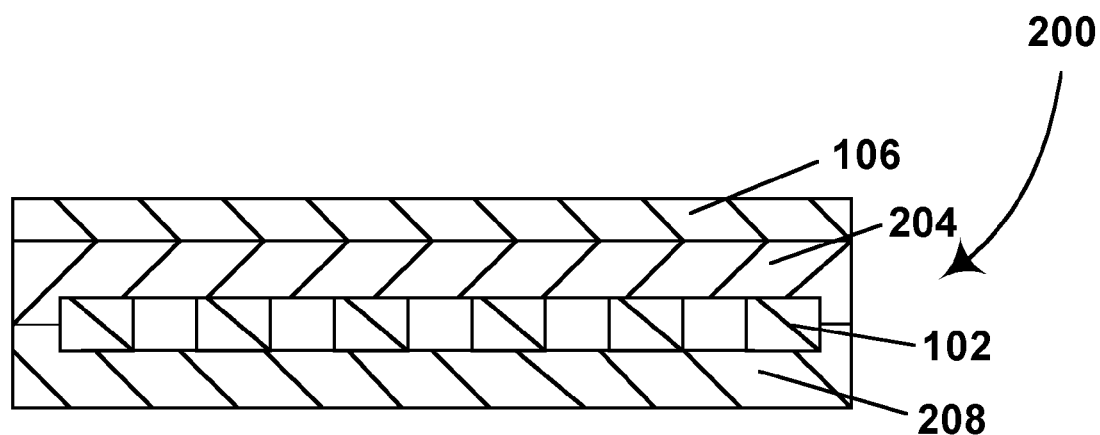
FIG. 2 is a schematic cross-section through a second patterned metal foil backplane of the present invention.

FIG. 2 of the accompanying drawings is a schematic cross-section through a second backplane (generally designated 200) of the present invention in which two different materials are used to encapsulate the metal foil 102. A first material 204 is used between the foil 102 and the electronic layer 106, while a second material 208 is used on the opposed side of the foil 102. The materials 204 and 208 can be selected from a wide variety of polymeric and inorganic materials. The use of two different materials 204 and 208 in this manner allows the backplane to achieve overall properties which may be difficult, if not impossible, to achieve using only the single polymeric material shown in FIG. 1. For example, the material 208 could be chosen for excellent barrier properties to gases and moisture, while the material 204 could be chosen for optimal planarization properties. In this second embodiment, the foil 102 again provides critical dimensional stability and mechanical strength.

Figure 3:
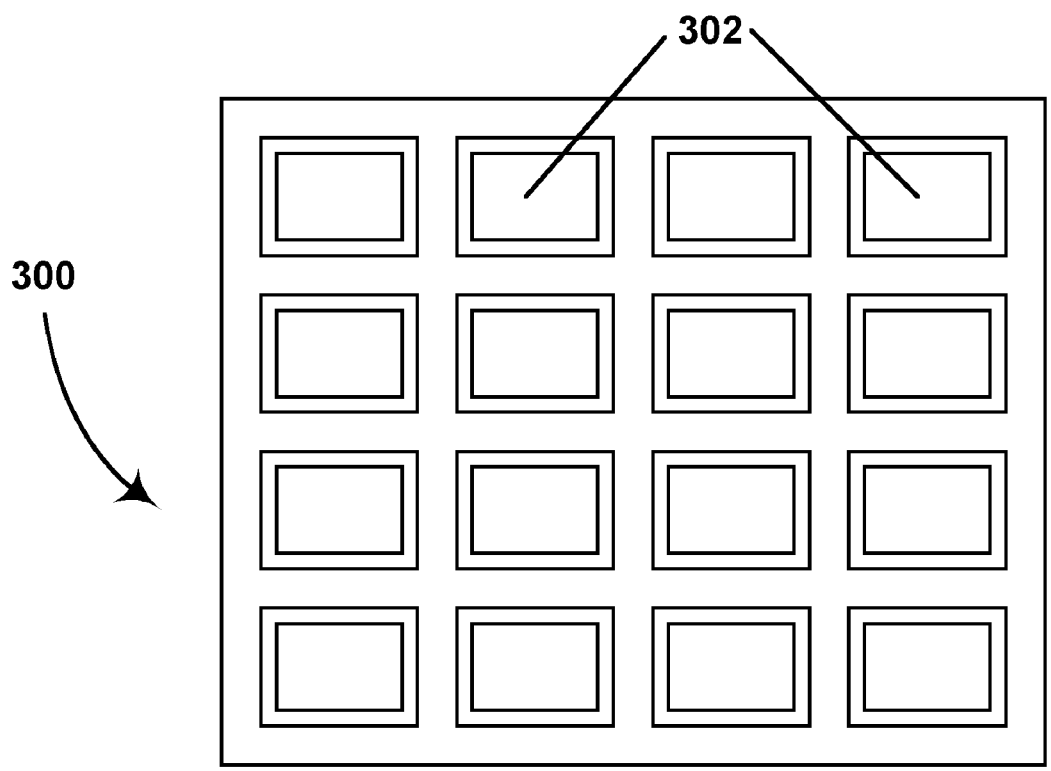
FIGS. 3 and 4 are schematic top plane views of third and fourth patterned metal foil backplanes of the present invention.
Figure 4:
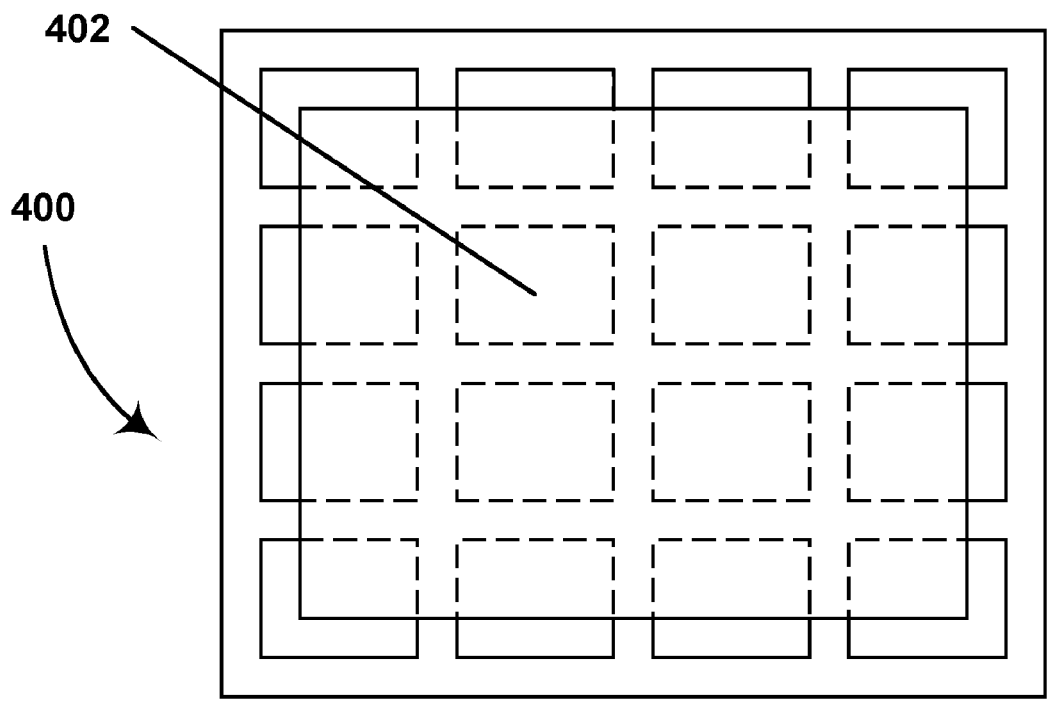

The patterning of the metal foil used in the backplane of the present invention can vary widely depending upon the type of display into which the backplane is to be incorporated. FIGS. 3 and 4 of the accompanying drawings illustrate two differing arrangements of backplanes and patterned metal foils useful in the present invention. FIG. 3 illustrates a sheet 300 comprising multiple backplanes 302 arranged to that the electronic component area of each backplane 302 lies entirely within one cell of the metal foil grid; in the illustrated embodiment, the electronic component area lies within a single aperture in the grid. In this embodiment, the metal foil mesh effectively frames each individual backplane throughout the process used to form the electronic components, and as a result the dimensional instability of the polymeric material which supports the electronic components is restricted to the area within one aperture of the mesh. After the electronic components have been formed (and optionally after the electro-optic medium has been coated over the components), the metal foil framing the individual backplanes could be removed, for example by shearing, to leave the electronic components supported only by the polymeric material. Alternatively, the multiple backplane sheet 300 could be divided along the center lines of the metal foil grid, thus leaving each backplane with a metal frame; the presence of such a metal frame may be useful for mounting the final display in an electronic device in which it is to be used.

In contrast, FIG. 4 illustrates a sheet 400 comprising a single backplane 402 which is substantially larger in both dimensions than one cell of the metal foil grid so that the backplane 402 extends across several cells in each dimension. In this embodiment, the dimensional stability of the backplane will be essentially the same as that of a comparable backplane formed on a continuous metal foil, but the backplane of FIG. 4 will be of substantially lower weight.

Which of the embodiments of FIGS. 3 and 4 is preferred in any specific application will vary with a number of factors, including the size of the display and the amount of mechanical handling and/or abuse to which it will be subjected. For example, the aforementioned US 2002/0090980 describes a cellular telephone having a small internal display of conventional dimensions and a larger flexible external display which can be moved between a rolled-up stored position, in which it lies within the housing of the telephone, and an extended position in which it lies flat alongside the telephone, thus providing a larger screen useful for, inter alia, reading lengthy E-mail messages. In such a telephone, the internal screen, which is protected by the telephone housing and fixed in position, could use the embodiment of FIG. 3, while the external display, which is not so protected when in its extended position, and is subject to repeated handling, could use the embodiment of FIG. 4.

The patterned metal foil backplane of the present invention allows for substantial weight reduction in the backplane of an electro-optic display while maintaining the dimensional stability and structural integrity of such a backplane based on a steel or other strong metal foil. The backplane of the present invention can be manufactured inexpensively, since steel can be rolled into a pattern and polymeric materials or inorganic slurries can be wet coated or laminated in a continuous fashion. The present invention also provides manufacturing flexibility and allows use of conventional materials.

Conductive via Backplane

The benefits of using a metal foil as a substrate in the backplane of an electro-optic display are not, however, confined to mechanical support. In additional to providing mechanical support and dimensional stability during formation of electronic components, such a metal foil can be used as part of the electronic circuitry of the backplane.

Accordingly, as already mentioned, this invention provides a conductive via backplane for use in an electro-optic display, this backplane comprising a metal foil coated on one or both sides with an insulating polymeric material and having a plurality of thin film electronic devices provided on the insulating polymeric material, the backplane further comprising at least one conductive via extending through the polymeric material and electrically connecting at least one of the thin film electronic devices to the metal foil. In such a backplane, the metal foil may or may not be patterned beyond any apertures required for formation of the via(s).

Figure 5A:
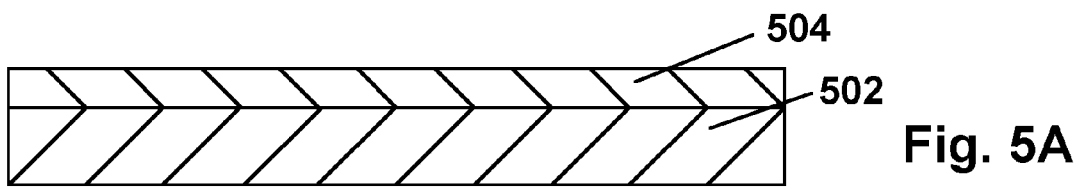
FIGS. 5A-5D are schematic cross-sections showing different stages in the formation of a conductive via backplane of the present invention.
Figure 5B:
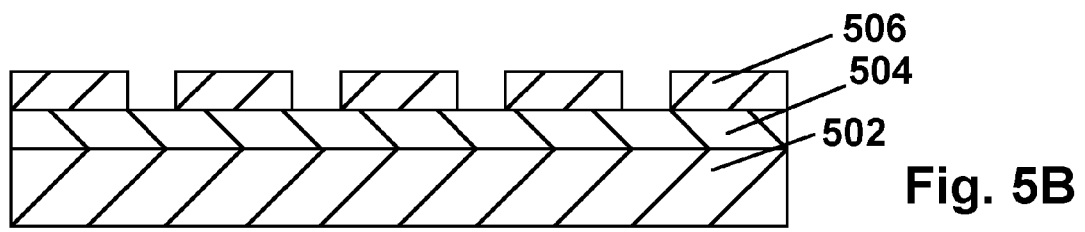
Figure 5C:
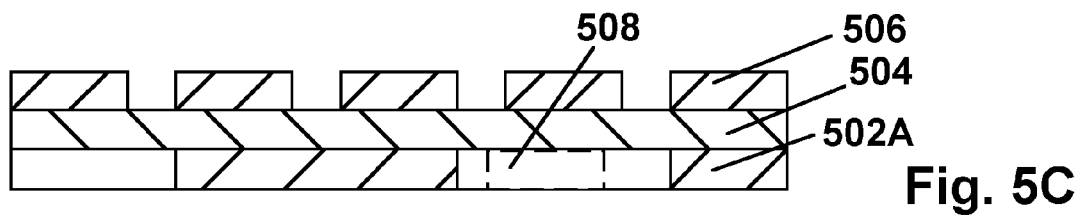

A preferred process forming a conductive via backplane of the present invention is illustrated in FIGS. 5A-5D of the accompanying drawings, which show schematic sections through the backplane at successive stages of the process. The process begins with a metal foil substrate 502, which may be formed from No. 304 stainless steel or beryllium copper. This foil 502 is coated on one surface with an insulating polymeric material 504, for example the aforementioned HD Microsystems 5878G, and the polymeric material is cured to form the structure shown in FIG. 5A. (Alternatively, a polymeric material may be laminated to the foil 502.) Electronic components 506, such as transistors and diodes, are then fabricated on the exposed surface of the polymeric material 504 using conventional semiconductor fabrication techniques to form the structure shown in FIG. 5B. Next, the foil 502 is patterned using, for example, photolithography or laser scribing to produce a patterned metal layer 502A, as shown in FIG. 5C; in this step, the remaining portions of the foil 502 and/or the exposed areas of the polymeric material 504 may if desired be thinned to a desired thickness or weight. Also, at this point additional conductive, semiconductive or insulating materials can be deposited and patterned to create passive or active components on the exposed surface of the polymeric material 504, as indicated schematically at 508.

Figure 5D:
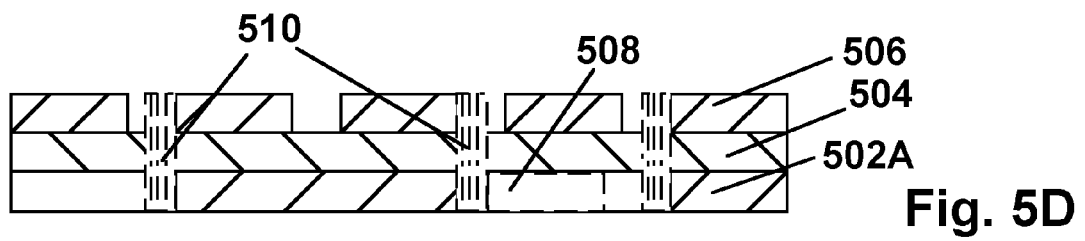

The last step of the process is the formation of via apertures through the polymeric material 504 and the filling of these via apertures with conductive material to form vias 510 interconnecting electronic components 506 and the patterned metal layer 502A, and optionally any additional components 508 to produce the structure shown in FIG. 5D. The via apertures may be, for example, etched, punched or laser-drilled through the polymeric material 504 so as to expose areas of the previously hidden surfaces of the electronic components 506. The via apertures may then be filled using a variety of materials and techniques including printing (for example, ink-jet, screen, or offset printing) application of conductive resins, shadow-mask evaporation or conventional photolithographic methods. Simple electrical connections can also be made along the edge of the substrate using thick film conductors.

During the last two steps of this process (i.e., the patterning of the foil and the formation and filling of the via apertures), it may be necessary or desirable to protect or passivate the exposed electronic components 506 in order to prevent damage thereto. Those skilled in semiconductor fabrication technology will be aware of conventional techniques for such protection and/or passivation, for example covering the electronic components 506 with a sacrificial protective or passivating layer, which can later be etched away without damage to the components themselves. It may also be necessary or desirable to attach the structure shown in FIG. 5B to a separate rigid carrier or substrate during these last two steps of the process, especially if the patterned metal layer 502A, and/or the exposed areas of the polymeric material 504 are to be thinned.

An alternative process for producing the structure shown in FIG. 5D starts from a thick polymeric foil, for example a 25-50 μm polyimide foil (with no attached metal layer). In the first step of this alternative process, electronic components are fabricated on one surface of the polymeric foil. Metal conductors and any desired additional electronic components are then formed on the opposed surface of the foil, followed by the formation of via apertures by the techniques previously described, and finally the via apertures are filled to form vias. Although this alternative process resembles certain prior art processes for the production of double-sided flexible circuit boards, it differs therefrom in that the electronic components are fabricated directly on the polymeric foil, as opposed to being placed thereon in the case of a flexible circuit board. In this alternative process, the polymeric foil acts only as an insulator between the electronic components 506 and the circuitry on the opposed side of the polymeric foil; however, if desired, the polymeric foil could serve as the dielectric layer of a capacitor formed between two overlapping conducting layers on the top and bottom surfaces of the polymeric foil, as discussed in more detail below.

The patterned metal layer 502A and associated circuitry may serve a wide variety of functions, for example antennae, inductor loops, power planes, capacitors, capacitor contacts, pixel electrodes, and electromagnetic induction shielding.

The conductive via backplane of the present invention is especially, but not exclusively, intended for use in so-called "smart cards". In such a smart card, the electronic components on the front surface of the card (corresponding to the top surface in FIG. 5D) can serve to drive an electro-optic display, while the patterned metal layer and associated circuitry on the reverse side of the card can serve as antenna loops, signal lines and other components for communicating between the card and a card reading/writing apparatus.

The conductive via backplane of the present invention provides the advantages of improved electronic component integration and reduced cost by using the reverse side of a substrate, thus providing more compact (thinner) packaging. Such improved integration is especially useful in smart and credit cards, and in electronic label applications.

Controlled Voltage Conductive Layer

As already indicated, a third aspect of the invention relates to controlling the voltage applied to a backplane containing a conductive layer, an insulating layer and at least one transistor disposed on the opposed side of the insulating layer from the conductive layer, the backplane further being provided with means for varying the voltage applied to the gate of the transistor and thereby switching the transistor between on (conductive) and off (non-conductive) states. According to this aspect of the present invention, the conductive layer is maintained at a voltage different from ground and within the range of voltages applied to the source of the transistor during scanning of the display. If the maximum and minimum voltages applied to the source during scanning are Vmax and Vmin respectively, and the voltage applied to the conductive layer is Vc, then desirably these voltages should satisfy the relation:

$$(3*V\text{max}+V\text{min})/4 > Vc > (V\text{max}+3*V\text{min})/4,$$

most desirably should satisfy the relation:

$$(3*V\text{max})+2*V\text{min})/5 > Vc > (2*V\text{max}+3*V\text{min})/5,$$

and optimally should substantially satisfy the relation:

$$Vc=(V\text{max}+V\text{min})/2.$$

The major proportion of the power consumption of most electro-optic displays is accounted by a series of capacitive switching terms of the form:

$$P=0.5CV^2f$$

where C is the relevant capacitance, V is the voltage difference across the capacitative load and f is the driving frequency. Separate terms of this type occur for source line capacitance, gate line capacitance and pixel capacitance. However, typically the source line capacitance (column electrode capacitance, assuming the conventional allocation of gate lines to rows, source lines to columns and drain lines to pixel electrodes) dominates the power consumption of the display. As an example, for a SVGA (800×600) active matrix display scanned at a frame rate of 60 Hz, the source line is modulated at 28.8 MHz, the gate line at 36 kHz, and the pixel at 60 Hz, or to put it another way, in such a display every time a new line of the display is to be written, only one row electrode has to switched from high to low and one from low to high, whereas all 800 column electrodes have to be switched between random values depending upon the value of each pixel in the image being written.

Figure 6:
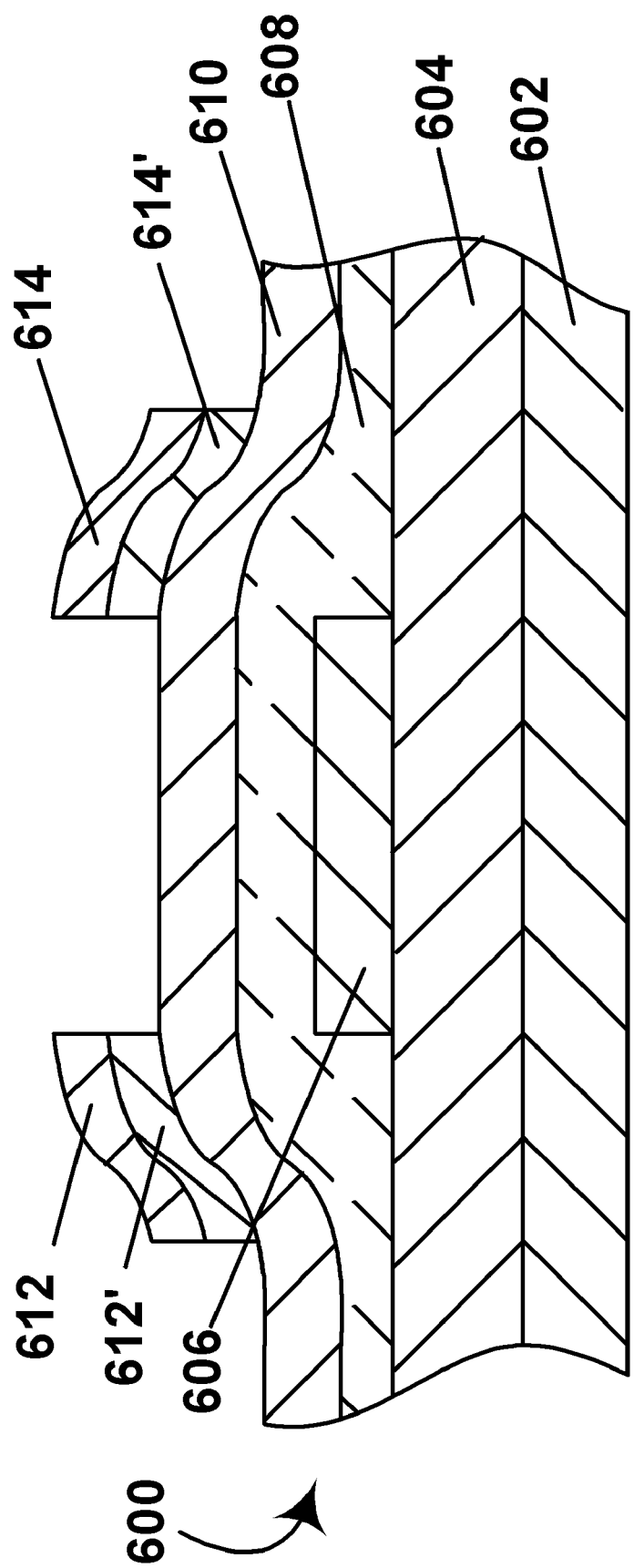
FIG. 6 is a schematic cross-section through a one transistor of a controlled voltage conductive layer backplane of the present invention.

FIG. 6 of the accompanying drawings is a schematic cross-section through a section (generally designated 600) of a backplane of the present invention, the section 600 containing only a single transistor. The backplane comprises a metal foil 602 and a polymeric material insulating layer 604. The transistor, which is of the thin film type and is formed directly on the exposed surface of the polymeric material 604 comprises a gate electrode 606, a gate dielectric layer 608 formed of silicon nitride, an amorphous silicon semiconductor layer 610 and source and drain electrodes 612 and 614 respectively, layers of n+amorphous silicon 612' and 614' being provided between the source and drain electrodes respectively and the semiconductor layer 610 in the conventional manner. The semiconductor layer 610 extends continuously between adjacent transistors as described in the aforementioned WO 00/67327.

The transistor shown in FIG. 6 is connected to row and column drivers in the conventional manner, with the source electrode 612 connected to a data signal on a column electrode (not shown), the drain electrode 614 connected to a pixel electrode (also not shown) and the gate to a select signal on a row electrode (also not shown). In the final electro-optic display, the pixel electrode lies adjacent the layer of electro-optic medium, and a transparent front electrode, which extends across all the pixels of the display, lies on the opposed side of the electro-optic medium and forms a viewing surface through which an observer views the display.

The gate voltage is typically 5 V in the off state of the transistor and 30 V in the on state, while the source voltage typically varies between 0 V and 20 V with the transparent common electrode set to approximately 10 V.

From what has been said above, it will be apparent that one major factor affecting the power consumption of the display is the energy loss due to the capacitance between the source electrode 612 and the metal foil 602; if, as is commonly the case, the thickness of the polymeric material 604 is less than or of the same order as the widths of the row and column electrodes and/or the pixel electrodes, the power consumption caused by this capacitative loss can be substantial. Since, as already mentioned, this energy loss is proportional to the square of the difference in voltage between the source line voltage and the voltage of the metal foil 602, and since the source line voltages can reasonably be assumed to be randomly distributed within the operating range, if the metal foil is simply allowed to float at or near ground potential, the average difference in voltage will be substantial and so will be the energy loss. To minimize the energy loss, the metal foil 602 should be maintained at or close to the middle of the range of source line voltages, which in this case is 10V. This may conveniently be done by tying the metal foil 602 to the voltage of the common front electrode.

If the metal foil 602 is made of a metal (for example, some stainless steel) which does not have high conductivity, a thin layer of a more conductive metal, for example, aluminum may be formed on the foil 602 before the polymeric material 604 is deposited thereon. The more conductive layer serves to improve the voltage uniformity across the metal foil during operation of the display.

From the foregoing, it will be seen that the controlled voltage conductive layer of the present invention can substantially reduce power consumption in active matrix electro-optic displays. In addition, the controlled voltage conductive layer of the invention may be useful in removing or reducing noise and certain display artifacts which have been observed and which are believed (although the invention is in no way limited by this belief) to be related to voltages induced in metal foils used in backplanes when the voltage on the metal foil is allowed to float.

Mesa Process

The mesa process of the present invention provides a method for reducing thin film strain and this film cracking during the formation of arrays of electronic components (especially, but not exclusively, backplanes for electro-optic displays) when such arrays are being formed on polymer-coated metal substrates. In modern fabs, display substrates can be as large as 1 meter square, and it is important that thin film strain be minimized across this large area.

As already indicated, in accordance with the mesa process of the present invention, instead of forming a continuous layer of polymeric material on the metal substrate, a plurality of discrete areas (hereinafter referred to as "mesas") of polymeric material are formed on the metal substrate, and a separate array of electronic components, preferably comprising a backplane for an electro-optic display, are formed on each of the discrete areas. In a preferred form of the mesa process, a continuous layer of polymeric material is formed over part of all of one surface of the metal substrate, and this continuous layer is divided to form the discrete mesas.

Figure 7:
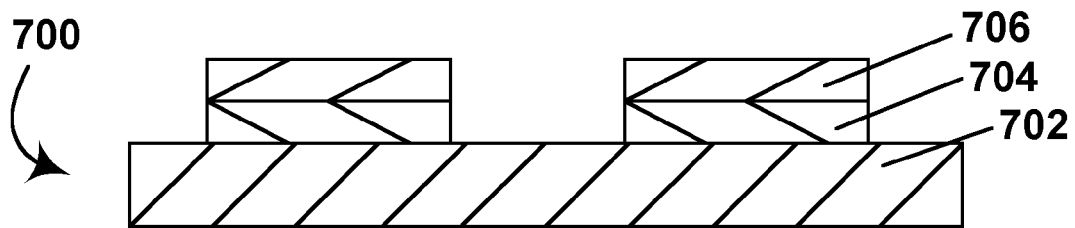
FIG. 7 is a schematic cross-section through part of a backplane prepared by a mesa process of the present invention.

FIG. 7 below depicts a preferred mesa process of the present invention. The structure (generally designated 700) shown in FIG. 7 comprises a metal foil substrate 702 of substantial area, typically 1 meter square. On this foil 702 are disposed two mesas 704 (FIG. 7 is simplified for ease of illustration; in practice more mesas would normally be present, and, to enable fabrication of the maximum numbers of products on each substrate, the gaps between the mesas would normally be substantially smaller than shown in FIG. 7) on each of which is formed a backplane 706 for an electro-optic display. The structure 700 is formed by first coating the entire foil 702 with a thick (6-8 μm) polyimide or other polymeric layer, patterning this polymeric layer to forms the discrete mesas 704 and then fabricating the backplanes 706 in the conventional manner. The patterning can be effected in a number of ways, including photolithography using wet or dry etch techniques or laser patterning.

The mesas 704 isolate the individual backplanes 706 from one another during fabrication of the backplanes, so that thin film strain becomes a function of the smaller mesa area rather than that of the entire substrate 702. The metal substrate 702 still ensures that dimensional stability is preserved.

Those skilled in semiconductor fabrication technology will appreciate that many of the thin film deposition techniques used in such fabrication will, when applied to the structure of FIG. 7, deposit films over the whole area of the substrate 702, including the areas between the discrete mesas 704. The presence of such films extending between adjacent mesas is undesirable since it tends to increase thin film strain on the components being formed on the mesas. To prevent such "bridging" of the non-mesa areas of the substrate by the deposited films, it is preferred to undercut the mesas by over-etching during at least one etching step of the process used, typically after photoresist patterning, for fabrication of the backplanes 706.

Figure 8A:
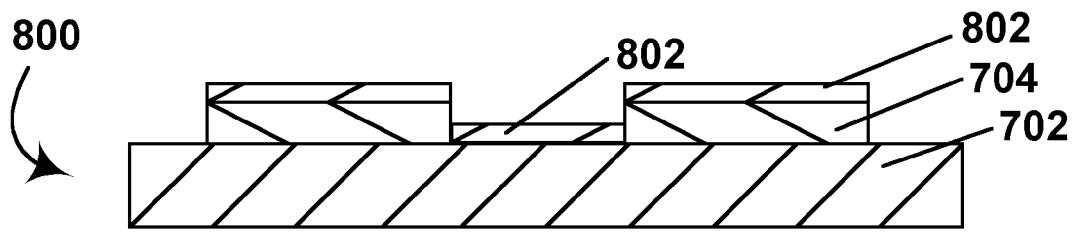
FIGS. 8A and 8B are schematic cross-sections showing different stages in a second mesa process of the present invention, in which the edges of the mesas are undercut.
Figure 8B:
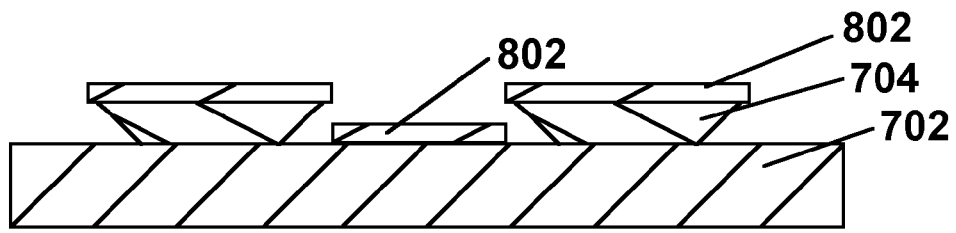

FIGS. 8A and 8B illustrate such an "over-etching" process. FIG. 8A shows a structure 800 generally similar to that of FIG. 7, but at an intermediate state of fabrication of the backplanes 706, in which a thin film 802 has been deposited on the substrate 702 carrying the mesas 704. As shown in FIG. 8A, the thin film 802 extends not only across the tops of the mesas 704 but also between adjacent mesas, thus bridging the mesas and increasing thin film strain (it will be appreciate that the thin film 802 will be present not only between the two mesas 704 but also on the other exposed portions of the substrate 702 adjacent the edges thereof; however, this portion of thin film 802 is omitted from FIGS. 8A and 8B for ease of comprehension). FIG. 8B shows the results of over-etching the structure of FIG. 8A, thus undercutting the mesas 704 and breaking the physical connections between the mesas and the intervening portion of thin film 802. It will be seen from FIG. 8B that the over-etching breaks the contact between the mesas 704 and the intervening portion of thin film 802, thus mechanically isolating the mesas 704 from one another and avoiding excess thin film strain during later fabrication steps.

A typical mesa process of the present invention would be as follows:
(a) Clean metal foil substrate;
(b) Coat metal foil substrate with 6-8 μm of polyimide (for example, the aforementioned HD Microsystems 5878G);
(c) Bake polyimide at 100° C. to drive off solvents;
(d) Apply, pre-bake, pattern (to form desired mesa pattern), develop, and post-bake photoresist;
(e) Wet-etch polyimide mesas with or without undercutting of the mesas;
(f) Cure polyimide layer at 300° C.; and
(g) Proceed with remaining steps of TFT fabrication process.

As already indicated, the mesa process of the present invention reduces thin film strain for large substrates by making the circuit strain a function of the mesa area (essentially the area of each individual backplane or other electronic array) instead of the area of the entire substrate, and enables economical mass production of flexible microelectronics for displays and other applications.

Stitchable Displays

As already indicated, a further aspect of the present invention relates to methods for the integration of flexible electro-optic displays into fabrics, other woven materials, and other flexible materials (for example, leather and polymeric films used in clothing) having similar characteristics. The most practicable way of attaching such flexible electro-optic displays into fabrics and similar materials is by stitching; however, flexible electro-optic displays cannot readily be stitched. Piercing polymeric or metal layers may result in harmful kinks in such layers or may introduce cracks into brittle thin film circuits forming part of the displays.

It has now been realized that the use of metal foils provided with apertures provides a solution to the problem of attaching flexible electro-optic displays into fabrics and similar materials.

Accordingly, the present invention provides an electro-optic display having a metal substrate, the display having a central portion comprising an electro-optic material and means for writing an image on the electro-optic material, and a peripheral portion extending around at least part of the periphery of the central portion, the peripheral portion having a plurality of apertures extending through the metal substrate, by means of which apertures the electro-optic display may be stitched to a flexible medium. Very desirably, the peripheral portion of such a display is free from the electro-optic material. In a preferred form of the invention, the peripheral portion extends completely around the central portion so that the entire periphery of the electro-optic display can be stitched into the fabric or other flexible material.

Figure 9:
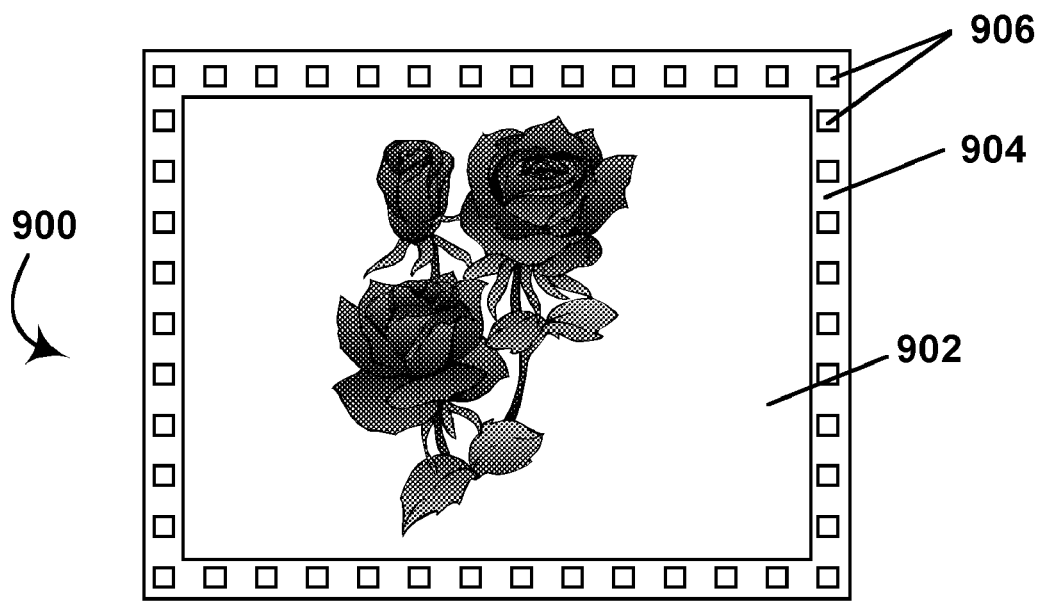
FIG. 9 is a schematic top plan view of a stitchable display of the present invention.
Figure 10:
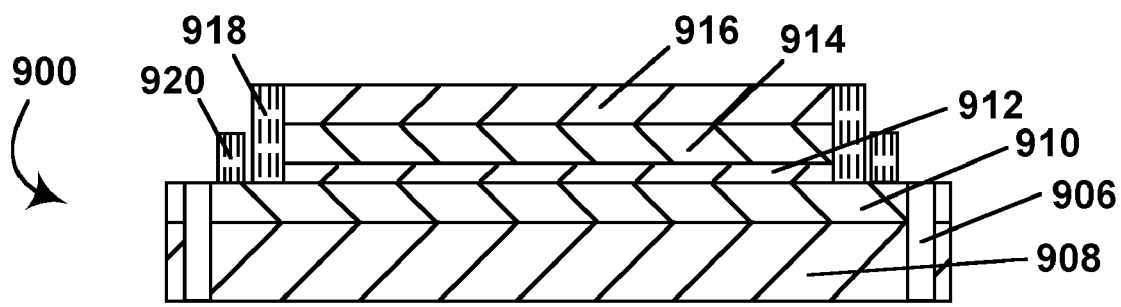
FIG. 10 is a schematic cross-section through the stitchable display shown in FIG. 9.

A preferred stitchable display of the invention is illustrated in FIGS. 9 and 10, which are respectively a top plan view and a section thorough the stitchable electro-optic display.

FIG. 9 shows an electro-optic display (generally designated 900) having a central portion 902 comprising an electro-optic material on which an image is displayed. The central portion 902 is completely surrounded by a peripheral portion 904, which is free from the electro-optic material but which is provided with a plurality of apertures 906 by means of which the electro-optic display can be stitched to a fabric or other flexible material.

The construction of the display 900 is shown in more detail in FIG. 10; for ease of illustration, the thickness of the display is greatly exaggerated in FIG. 10 and FIGS. 9 and 10 are not strictly to the same scale in order to show certain details of construction in FIG. 10. From this Figure it well be seen that the display 900 comprises a metal foil substrate 908 through the peripheral portion of which pass the apertures 906. The upper surface (in FIG. 10) of the substrate 908 is covered with a layer of polymeric material 910, on the upper surface of which is formed a TFT array 912 which forms the backplane of the display 900. A layer of electro-optic material 914 is disposed on the TFT array 912, and a front protective layer 916 bearing on its lower surface a single continuous electrode (not shown) is disposed on the electro-optic material 914. The upper surface of the protective layer 916 forms the viewing surface of the display. An edge seal 918 extends around the periphery of the electro-optic material 914 and prevents the ingress of moisture to the electro-optic material 914; several types of electro-optic media are sensitive to humidity. Bonded integrated circuits 920 are shown disposed on the electro-optic material 914 outside the edge seal 918. These circuits 920, which are omitted from FIG. 9, may be, for example, circuits used to convey data to the TFT array 912.

As already mentioned, the electro-optic material 914 does not cover the peripheral portion 904 of the display 900, i.e., the edge seal 918 lies wholly within the rectangle defined by the apertures 906. The polymeric material 910 does, however, extend over the entire upper surface of the metal foil 908. In FIG. 10, the apertures 906 are shown as extending through both metal foil 908 and the polymeric material 910. However, this is not essential; the apertures need only extend through the metal foil 908, since the polymeric material 910 can be pierced during stitching of the display 900 without risk of damage to the central portion 902 of the display. The apertures 906 may be formed by, for example, laser ablation, stamping or photo-etching. Alternatively, the electro-optic display may use a patterned metal foil backplane of the present invention, in which case simply leaving an additional peripheral area of the metal foil extending beyond the edges of the electro-optic material will provide the apertures needed for stitching.

The stitchable displays of the present invention are useful not only for electro-optic displays intended for application to clothing, but may also be useful in the construction of large area flexible displays formed from multiple "tiles" (smaller displays).

From the foregoing it will be seen that the stitchable displays of the present invention allows ready and simple attachment of flexible displays using metal foils to fabrics and similar flexible materials without the use of adhesives, which are undesirable for many applications of flexible displays.

1D-Curved Processes

As already mentioned, this invention provides a (first) process for forming an electro-optic display on a substrate curved in one dimension. This process begins with a backplane containing at least one pixel electrode, this backplane being curved in one dimension. The backplane may be pre-formed in this curved configuration, formed flat and flexed into the curved configuration, or bonded, preferably permanently, to a surface curved in one dimension. There is then applied to the curved backplane a laminate comprising a layer of electro-optic medium and a light-transmissive electrically-conductive layer, the laminate being applied so that the electro-optic medium ends up between the backplane and the electrically-conductive layer. The laminate may, and typically does, also comprise a layer of lamination adhesive overlying the layer of electro-optic medium, and the process is carried out so that this layer of lamination adhesive is in immediate contact with the backplane. The laminate is then bonded to the backplane under heat and/or pressure, for example using a bladder press or a heated roll laminator, so that the electro-optic medium bonds to the backplane with minimal stress on the electro-optic medium; any internal stress in the electro-optic medium may be relaxed during the bonding process as the material is allowed to flow. Consequently after the process has been completed, subsequent material creep in the finished display is minimized. Finally, the edges of the laminate and the backplane can be cut and/or sealed using an appropriate sealant.

The laminate used in this process may be prepared by removing the release sheet from a "front plane laminate" as described in copending application Ser. No. 10/249,957, filed May 22, 2003 (Publication No. 2004/0027327). Alternatively, in accordance with the second 1D-curved process of the present invention, this process may be modified to use a "double release film" as described in copending Application Serial No. 10/605,024, filed Sep. 2, 2003 (Publication No. 2004/0155857). Such a double release film comprises a layer of a solid electro-optic medium ("solid" in the sense of having solid external surfaces, although it may contain liquid or gas-filled internal cavities) with adhesive layers on both sides; either or both of these adhesive layers may be covered by a release sheet. To use such a double release film in the process, one adhesive layer is exposed and the double release sheet is laminated to the backplane in the manner already described. The second adhesive layer is then exposed, and an electrically-conductive layer (typically covered by a protective and/or filter layer) is laminated over the layer of electro-optic medium in a second lamination step.

Figure 11:
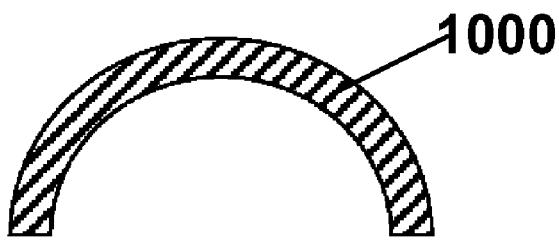
FIGS. 11 to 13 are schematic cross-sections showing different stages in a first 1D-curved process of the present invention.
Figure 12:
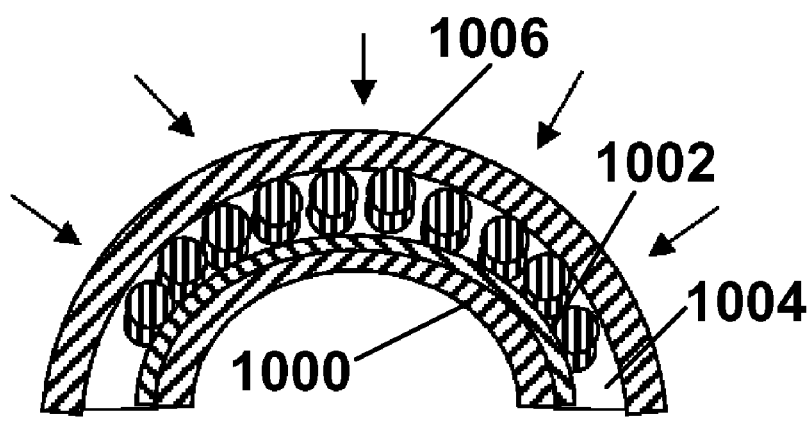
Figure 13:
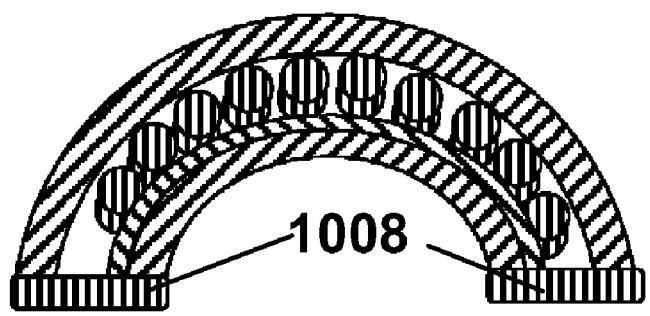

FIGS. 11 to 13 of the accompanying drawings illustrate a preferred variant of the first 1D-curved process of the present invention. As already described, this process begins with a backplane 1000 (FIG. 11) which is curved in one dimension; the backplane 1000 illustrated has substantially the form of a hollow hemicylinder, but obviously other forms curved in one dimension could be used, for example a small arc of a large diameter cylinder, parts of an elliptical cylinder etc. The backplane 1000 may be pre-formed, formed flat and then flexed, or permanently bonded to a surface curved in one dimension. Also, the backplane may be of the direct drive type with a plurality of pixel electrodes and circuitry for varying the voltage applied to each pixel electrode independently, or may be of the active matrix type.

In the first step of the process, as shown in FIG. 12, a laminate comprising an adhesive layer 1002 (this layer may be omitted in the electro-optic medium used is of a type which can adhere to the backplane 1000 without use of an "external" adhesive layer), an electro-optic layer 1004 (illustrated as an encapsulated electrophoretic layer comprising a plurality of capsules in a binder, but other types of electro-optic medium may of course be used) and a light-transmissive electrically-conductive layer 1006, is laminated under pressure (as indicated by the arrows in FIG. 12) and at an elevated temperature, to the surface of the backplane 1000. Typically, the light-transmissive electrically-conductive layer 1006 will be much thinner relative to the other layers than illustrated in FIG. 12, but will be provided upon a transparent substrate (not shown). For example, the electrically-conductive layer 1006 could have the form of a layer of indium tin oxide (ITO) or a conductive polymer formed on a polymeric film; ITO-coated polymeric films are available commercially and may be used as the electrically-conductive layer 1006 and the transparent substrate. The transparent substrate provides mechanical support and protection for the relatively thin and fragile electrically-conductive layer 1006.

The lamination process shown in FIG. 12 is conveniently effected using a bladder press or a heated roll laminator. By performing the lamination with the backplane in the curved configuration, the electro-optic medium is bonded to the backplane with minimal strain. Typically, the lamination of the electro-optic medium to the backplane is effected at a curing temperature for the lamination adhesive layer 1002 which is higher than the glass transition temperature of a binder present in the electro-optic medium, so that internal stress within the electro-optic layer is relaxed during the lamination procedure as the electro-optic medium is allowed to flow. Consequently, creep within the electro-optic medium after the lamination shown in FIG. 12 is minimized, and the problems associated with such creep are also minimized.

After the lamination step shown in FIG. 12, the edges of the electro-optic medium layer and the backplane may be cut and sealed using an appropriate encapsulant, shown as 1008 in FIG. 13.

2D-Curved Process

Finally, as already indicated, this invention provides a process for forming an electro-optic display on a curved surface; this surface may be curved in one or both dimensions. The process begins with a curved backplane. A coatable electro-optic medium, such as an encapsulated electrophoretic medium, is sprayed or printed on to the surface of the backplane, and if necessary dried, cured or otherwise treated to form a coherent layer. A transparent electrically-conductive layer is sprayed or printed on to the surface of the electro-optic medium, and if necessary dried, cured or otherwise treated to form a coherent layer. A transparent encapsulant is sprayed or printed on to the surface of the electrically-conductive layer, and if necessary dried, cured or otherwise treated to form a coherent layer. Optionally, in a final step of the process, an edge sealant is applied by spraying or printing around the edge of the display to protect the electro-optic medium and possibly other components of the display from the environment, for example to prevent exchange of water and/or oxygen between the display and the surrounding environment.

Figure 14:
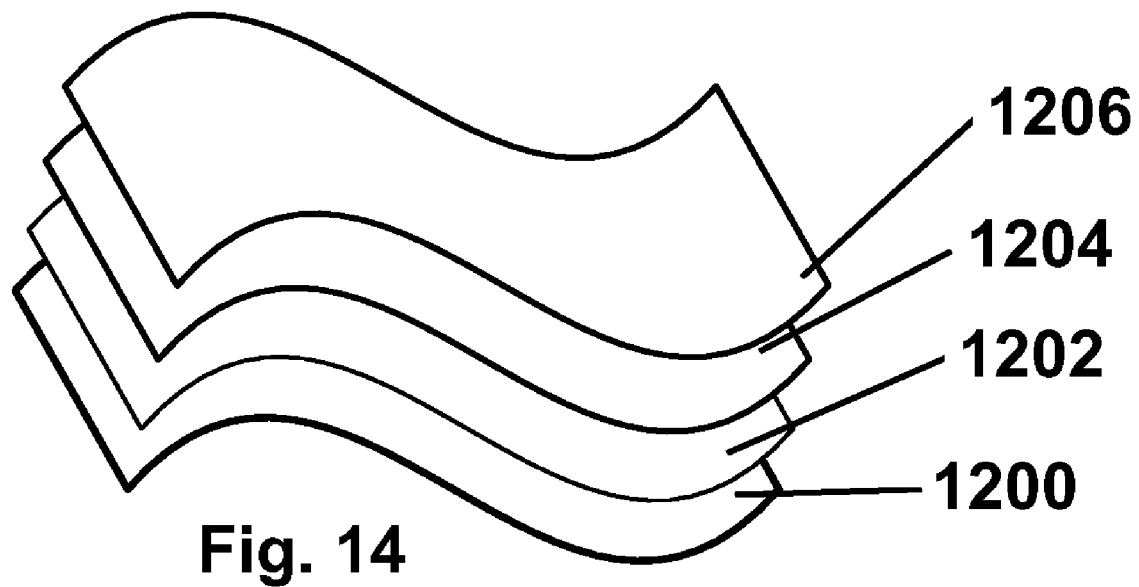
FIG. 14 is a schematic three quarter view of a 2D-curved process of the present invention.

Although this process can be applied to a surface which is curved in one or two dimensions, the process is primarily intended for use on surfaces curved in two dimensions. The basic structure of the display formed by this process is illustrated in FIG. 14; the display consists of:

(a) a backplane 1200, which may be of an active matrix transistor, passive or direct drive type, and will typically be formed on a polymeric film, metal foil or a combination thereof (see the aforementioned 2002/0019081 for backplanes formed on stainless steel foils covered with a polyphenylene polyimide);

(b) an electro-optic medium layer 1202, typically an encapsulated electro-optic medium layer, which can be of an electrophoretic, liquid crystal, or emissive type;

(c) a light transmissive (preferably transparent) electrically-conductive layer 1204, which may be formed from organic or inorganic materials; and (d) a light transmissive (preferably transparent) encapsulant or protective layer 1206, which may be formed from organic or inorganic materials.

The backplane 1200 may be a pre-formed backplane, or an originally flat backplane flexed into the configuration shown. The backplane may also be bonded to a curved surface. The backplane can be printed on to a pre-formed flexible substrate, for example a substrate formed by casting material in a die.

To form the preferred display shown in FIG. 14, an encapsulated electro-optic material is sprayed or printed on to the surface of the backplane 1200; in most cases, the resultant electro-optic medium layer 1202 will need to be dried or cured to from a coherent layer. The encapsulated electro-optic material may be sprayed or printed in wet or dry form, for example in the form of a slurry or an aerosol. Single or multiple layers of electro-optic material may be applied to the backplane 1200 before the final layer is dried or cured. Additional low stress under-fill resins or other polymeric binders can be applied before or after drying or curing to fill voids in the coating or to locally planarize the coating surface.

After formation of the electro-optic medium layer 1202 is complete, the light-transmissive electrically-conductive layer 1204 is superposed thereon by spraying or printing an appropriate material, which may be sprayed or printed in wet or dry form, for example in the form of a slurry or an aerosol; in some cases, drying or curing of the material may be required to form a coherent layer. Similarly, after formation of the electrically-conductive layer 1204 is complete, the light-transmissive encapsulant layer 1206 is superposed thereon by spraying or printing an appropriate material, which may be sprayed or printed in wet or dry form, for example in the form of a slurry or an aerosol; in some cases, drying or curing of the material may be required to form a coherent layer. Finally, a low-stress edge seal encapsulant (not shown) may be sprayed or printed on to the edges of the display to protect the display material from moisture or gas intake or to environmentally stabilize the display.

The preferred 2D-curved process of the present invention described above has the advantages that by coating each layer of the display directly on to a pre-formed curved backplane, material stress, creep, and therefore display non-uniformity, are minimized during subsequent operation and storage. The method is also suitable for use on flat substrates to enable manufacture of ultra-thin electro-optic displays. All the steps of the process can be implemented in a continuous fashion for manufacture, and the method provides a low-cost assembly process for conformal displays due to large material savings and the use of simple web-based or sheet-based manufacturing apparatus, such as spray coaters and infra-red lamps for curing.

Those skilled in the display art will appreciate that numerous changes, improvements and modifications can be made in the preferred embodiments of the invention already described without departing from the scope of the invention. For example, although the invention has been primarily described with reference to the use of encapsulated electrophoretic media, any of the other types of electro-optic media previously described may alternatively be used. Accordingly, the whole of the foregoing description is intended to be construed in an illustrative and not in a limitative sense.

The invention claimed is:

1. A backplane for use in an electro-optic display, the backplane comprising a patterned metal foil having a plurality of apertures extending therethrough, coated on at least one side of the patterned metal foil with an insulating polymeric material and having a plurality of thin film electronic devices provided on the insulating polymeric material, whereby the insulating polymeric material separates the thin film electronic devices from the patterned metal foil.

2. A backplane according to claim 1 wherein the apertures are arranged on a rectangular grid.

3. A backplane according to claim 1 wherein the apertures occupy at least about 30 percent of the area of the patterned metal foil.

4. A backplane according to claim 3 wherein the apertures occupy at least about 60 percent of the area of the patterned metal foil.

5. A backplane according to claim 1 wherein the patterned metal foil is coated on both sides with an insulating polymeric material.

6. A backplane according to claim 5 wherein the patterned metal foil is coated on both sides with the same insulating polymeric material.

7. A backplane according to claim 5 wherein the patterned metal foil is coated on its two sides with different insulating polymeric materials.

8. A backplane according to claim 1 wherein each of the thin film electronic devices lies entirely within the area of one aperture in the metal foil.

9. A backplane according to claim 1 wherein each of the thin film electronic devices extends across a plurality of apertures in the metal foil.

10. An electro-optic display comprising a backplane according to claim 1.

11. An electro-optic display according to claim 10 comprising an encapsulated electrophoretic electro-optic medium.

12. A backplane for use in an electro-optic display, the backplane comprising a metal foil coated on at least one side with an insulating polymeric material and having a plurality of thin film electronic devices provided on the insulating polymeric material, the backplane further comprising at least one conductive via extending through the polymeric material and the metal foil and electrically connecting at least one of the thin film electronic devices to the metal foil, wherein the metal foil serves as at least one of an antenna, an inductor loop, a power plane, a capacitor, a capacitor contact, a pixel electrode, and electromagnetic induction shielding.

13. An electro-optic display comprising a backplane according to claim 12.

14. An electro-optic display comprising a backplane, the backplane comprising a metal foil coated on at least one side with an insulating polymeric material and having a plurality of thin film electronic devices provided on the insulating polymeric material, the backplane further comprising at least one conductive via extending through the polymeric material and the metal foil and electrically connecting at least one of the thin film electronic devices to the metal foil, the electro-optic display having the form a smart card, the metal foil serving to communication between the card and a card reading apparatus.

* * * * *